United States Patent [19]
Feldman et al.

[11] Patent Number: 5,904,523
[45] Date of Patent: May 18, 1999

[54] PROCESS FOR DEVICE FABRICATION IN WHICH A LAYER OF OXYNITRIDE IS FORMED AT LOW TEMPERATURES

[75] Inventors: Leonard Cecil Feldman, Nashville, Tenn.; Martin Laurence Green, Summit; Thomas Werner Sorsch, Edison, both of N.J.

[73] Assignee: Lucent Technologies Inc., Murray Hill, N.J.

[21] Appl. No.: 08/943,585

[22] Filed: Oct. 3, 1997

Related U.S. Application Data

[60] Provisional application No. 60/028,049, Oct. 3, 1996.

[51] Int. Cl.$^6$ .......................... H01L 21/336; H01L 21/31; H01L 21/469
[52] U.S. Cl. .......................... 438/263; 438/264; 438/762; 438/763; 438/758; 438/775; 438/769
[58] Field of Search .................................... 438/775, 769, 438/758, 762, 263, 264

[56] References Cited

U.S. PATENT DOCUMENTS

| | | |
|---|---|---|
| 4,343,657 | 8/1982 | Ito et al. . |
| 4,980,307 | 12/1990 | Ito et al. . |
| 5,258,333 | 11/1993 | Shappir et al. . |
| 5,455,204 | 10/1995 | Dobuzinsky et al. . |
| 5,674,788 | 10/1997 | Wristers et al. . |

OTHER PUBLICATIONS

Wolf, S. and Tauber, R.N., Silicion Processing for the VLSI Era, Lattice Press, pp. 57–58, 1986.
Ghandhi, Sorab K., VLSI Fabrication Principles, John Wiley & Sons, pp. 484–485, 1994.
"Effect of Oxygen Partial Pressure on Nitridation of Silicon", by Mittomo, M., *Journal of the American Ceramic Society* p. 527 (Nov.–Dec. 1975).
"Nitrogen Reaction at a Silicon–Silicon Dioxide Interface", by Raider, S. I. et al., *Applied Physics Letters,* vol. 27, No. 3 pp. 150–152 (Aug. 1, 1975).
"Conditions for Thermal Nitridation of Si in $N_2$–$O_2$ Mixtures", by Giridhar, R. V. et al., *J. Electrochem. Soc.: Solid–State Science and Technology,* pp. 2803–2807.
"Selective Oxidation Using Ultrathin Nitrogen–Rich Silicon Surface Layers Grown by Rapid Thermal Processing", by Paz de Araujo, C. A. et al., Microelectronics Research Laboratories, *J. Electrochemical Society,* vol. 136, No. 7, pp. 2035–2038.
"Review on Reactions Between Silicon and Nitrogen", by Jennings, H. M., *Journal of Materials Science,* 18 pp. 951–967 (1983).
"Thermodynamic Calculation of the Si–N–O System", by Hillert, M. et al., *Z. Metallkd.,* 83 pp. 648–654 (1992).
"Nitrogen Depletion During Oxidation in $N_2O$" by Saks, N.S. et al., Appl. Phys. Lett., 67 (3), pp. 374–376 (Jul. 1995).
"Ceramics for Turbines and Other High–Temperature Engineering Applications", Edited by Godfrey, D.J., Proceedings of the Britich Ceramic Society, No. 22, pp. 207–227 (Jun. 1973).

*Primary Examiner*—John F. Niebling
*Assistant Examiner*—Josetta I. Jones
*Attorney, Agent, or Firm*—Richard J. Botos

[57] ABSTRACT

A process for forming a silicon oxynitride layer in an $N_2$ atmosphere is disclosed. The silicon oxynitride layer is formed by heating a silicon substrate in an $N_2$ atmosphere for a period of time that is sufficient to form a nitrided layer with a nitrogen content of at least about $5\times10^{13}$ atoms/cm$^2$ therein. Afterward, the substrate is further oxidized in an oxygen containing atmosphere for a period of time sufficient to form a silicon oxynitride layer on the substrate with a thickness of at least about 1 nm and a nitrogen content of at least about $5\times10^{13}$ atoms/cm$^2$ on the wafer.

5 Claims, 2 Drawing Sheets

PROCESS FOR DEVICE FABRICATION IN WHICH A LAYER OF OXYNITRIDE IS FORMED AT LOW TEMPERATURES

CROSS-REFERENCE TO RELATED APPLICATION

This application claims priority of Provisional Application Serial No. 60/028049 filed Oct. 3, 1996.

BACKGROUND OF THE INVENTION

1. Technical Field

This invention is directed to a process for fabricating integrated circuit devices in which a layer of an oxynitride material is formed.

2. Art Background

Semiconductor devices such as MOS (metal-oxide-semiconductor) devices are typically formed on a substrate such as a silicon wafer. Insulating films of silicon dioxide are formed on the substrate over which is formed a gate electrode. The insulating film formed between the gate electrode and the silicon substrate is referred to as the gate oxide, or gate dielectric.

The incorporation of nitrogen into the gate oxide is advantageous because it improves certain characteristics of the oxide, such as the charge-to-breakdown of the oxide and its resistance to hot carrier damage. The presence of nitrogen in the gate oxide also acts as a barrier against boron diffusion from the overlying layers of doped polysilicon into the underlying silicon substrate.

Various methods for the incorporation of nitrogen into silicon dioxide have been proposed. Currently, a silicon wafer is heated in an atmosphere of either $N_2O$ or NO for a period of time that is adequate to incorporate the desired amount of nitrogen into the growing silicon dioxide film. This may or may not be followed by further oxidation of the wafer in an $O_2$ atmosphere, depending on the desired thickness of the resulting film.

Processes for forming silicon oxynitride have been the subject of considerable investigation. Saks, N. S., et al., "Nitrogen depletion during oxidation in $N_2O$," *Appl. Phys. Lett.*, Vol. 67(3), pp. 374–376 (1995) describes tests in which $N_2O$-oxidized silicon wafers are placed in an atmospheric oxidation furnace at 900° C. After about five minutes in an $O_2$ atmosphere, the wafers were re-oxidized in pure $N_2O$. Saks et al. observe that nitrogen is incorporated into the oxide at lower temperatures (900° C.) in an $N_2O$ atmosphere than the temperature at which nitrogen is incorporated into the silicon in an $N_2$ atmosphere. However, Raider, S. I., et al., "Nitrogen reaction at a silicon—silicon dioxide interface," *Appl. Physics Letters*, Vol. 27(3), pp. 150–152 (1975) observes that continuous nitride films do not form to any significant thickness at temperatures less than about 1200° C.

As observed by Saks et al., the NO species formed by the breakdown of $N_2O$ at the furnace temperature depletes nitrogen from the bulk of the oxide, resulting in an unequal distribution of nitrogen in the oxide, with the bulk of the nitrogen concentrated at the interface between the oxide and the underlying substrate. Since nitrogen acts as a barrier to boron diffusion, the nitrogen content at the oxide/substrate interface does not prevent boron from penetrating the oxide, but, rather, merely prevents the boron from diffusing further into the underlying substrate. The presence of boron in the oxide will degrade oxide reliability. Therefore, a process that provides a more uniform distribution of nitrogen in the silicon oxynitride layer is desired.

Furthermore, the current processes for forming silicon oxynitride utilize atmospheres of nitrous oxide ($N_2O$) or nitric oxide (NO). These gases are expensive and both of them are asphyxiants, so their use must be carefully controlled. Therefore, a process that utilizes a less expensive source of nitrogen is desired.

SUMMARY OF THE INVENTION

The present invention is directed to a process for device fabrication in which nitrogen is incorporated into the gate oxide layer formed on a silicon substrate by heating the substrate in an $N_2$ atmosphere at temperatures in the range of about 850° C. to about 1050° C. In the process of the present invention, a silicon substrate (referred to herein as a silicon wafer) which has been subjected to a conventional processing sequence up to the point where the gate oxide is to be formed thereon is placed in a conventional apparatus for growing oxide on silicon substrates. Typically the apparatus is either a furnace or a rapid thermal processing (RTP) apparatus.

In the embodiment of the present invention wherein the apparatus is a furnace, an $N_2$ atmosphere is introduced into the apparatus and the temperature of the furnace is maintained within the above-prescribed temperature range. The wafer is then subjected to what is referred to herein as a nitridation step followed by an oxidation step. In the nitridation step, the wafer is placed in the furnace for a period of time that is sufficient to provide a nitrogen content per unit area of at least about $5\times10^{13}$ (atoms)/cm$^2$ in the silicon oxynitride layer that results from the nitridation step followed by the oxidation step.

The wafer is then subjected to the oxidation step in which the wafer is further oxidized in an $O_2$ atmosphere at a temperature and for a period of time sufficient to form a silicon oxynitride layer on the wafer with a thickness of at least about 1 nm. Typically, temperatures in the range of about 800° C. to about 950° C. are selected to oxidize silicon in a furnace. However, one skilled in the art will appreciate that the selected temperature is largely a matter of design choice, with lower temperatures providing a slower rate of oxidation and higher temperatures providing a faster rate. Of course, the selected temperature must be sufficiently high to promote the oxidation reaction, but sufficiently low to avoid damaging the silicon wafer.

In the embodiment of the present invention wherein the apparatus is a RTP apparatus, the nitridation step again occurs in an $N_2$ atmosphere that is introduced into the RTP apparatus and the temperature of the wafer is increased from ambient temperature to a temperature within the above-prescribed temperature range in less than about 2 minutes. The exact amount of time it takes for the RTP apparatus to ramp to the desired temperature range is a largely a matter of design choice. It is contemplated that any conventional ramping speed will be adequate for the purposes of the present invention. The wafer is subjected to the nitrogen atmosphere for a period of time that is sufficient to provide a layer with a nitrogen content per unit area of at least about $5\times10^{13}$/cm$^2$. After the nitridation step, the wafer is subjected to the oxidation step in an $O_2$ atmosphere for a period of time sufficient to form a silicon oxynitride layer on the wafer with a thickness of at least about 1 nm. Typically, the oxidation step takes place at temperatures in the range of about 900° C. to about 1400° C. for a period of time of about 5 seconds to about 60 seconds. However, as noted above, the time and temperature are largely a matter of design choice, subject to the parameters previously described.

After the silicon oxynitride layer is formed on the wafer, it is further processed to form semiconductor devices thereon. One skilled in the art will appreciate that silicon oxynitride layers are used in a variety of MOS (metal-oxide-silicon) devices. Furthermore, one skilled in the art will appreciate that the process of the present invention is compatible with virtually all processes for fabricating MOS devices.

DETAILED DESCRIPTION

The present invention is directed to a process for forming a silicon oxynitride layer as the gate oxide layer in a process for semiconductor device fabrication. In the process, a silicon wafer is placed in a conventional apparatus used to grow oxide on a silicon wafer. Prior to being placed in the apparatus, the silicon wafer is cleaned to remove the native oxide and other contaminants that may have formed or collected on its surface. The cleaning techniques are well known to one skilled in the art and are not described in detail herein.

The silicon oxynitride is formed by placing the wafer in a conventional apparatus for forming oxide on the surface of a silicon substrate. These apparatus are typically either a conventional furnace or an RTP apparatus. The wafer is then subjected to a nitridation step followed by an oxidation step. In the nitridation step, a nitrogen atmosphere is introduced into the heating apparatus and the wafer is subjected to the nitrogen atmosphere at an elevated temperature in the range of about 850° C. to about 1050° C.

Figure 1:
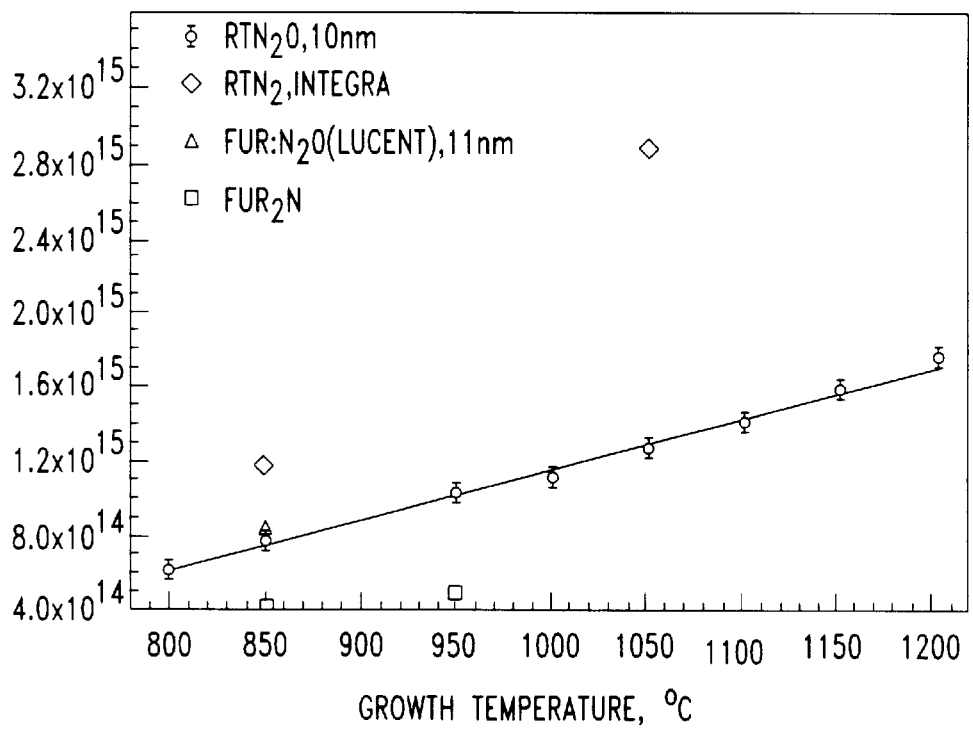
FIG. 1 illustrates the amount of nitrogen incorporated into a nitrided layer formed on a silicon substrate as a function of temperature using four different growth techniques: 1.) RTP in an $N_2O$ atmosphere; 2.) RTP in an $N_2$ atmosphere; 3.) furnace growth in an $N_2O$ atmosphere; and 4.) furnace growth in an $N_2$ atmosphere.

As illustrated in FIG. 1, the nitrogen content per unit area in the silicon is affected by the growth temperature, the atmosphere in which the growth occurs, and the apparatus in which the growth takes place. The solid line in FIG. 1 illustrates the nitrogen content per unit area after the wafer was subjected to a nitridation step in which a silicon wafer was heated in an RTP apparatus supplied with an $N_2O$ atmosphere at various temperatures. The wafers were heated for times sufficient to provide a silicon oxynitride layer with a thickness of about 10 nm. The wafers were heated in an $N_2O$ atmosphere at temperatures in the range of 800° C. to 1200° C. One wafer was heated in an $N_2O$ atmosphere at each 50° increment within this range. The length of time it took to form silicon oxynitride films of the desired thicknesses at temperatures of 850° C., 950° C., and 1050° C., and the nitrogen content in the films that resulted are summarized in Table 1 below. The nitrogen content of the film was measured using nuclear reaction analysis

TABLE 1

| TIME | TEMPERATURE | AMOUNT OF NITROGEN (N/cm$^2$) |
| --- | --- | --- |
| 600 seconds | 850° C. | 4 × 10$^{14}$ |
| 280 seconds | 950° C. | 6 × 10$^{14}$ |
| 80 seconds | 1050° C. | 8 × 10$^{14}$ |

The solid circles in FIG. 1 represent the measured amount of nitrogen in the oxynitride layers formed at the various temperatures, including the data points set forth in Table 1 above.

For purposes of comparison, a wafer was placed in a furnace supplied with an $N_2O$ atmosphere and heated at 850° C. for a time sufficient to grow a 10 nm thick layer of silicon oxynitride thereon. The amount of nitrogen in the resulting layer was 4×10$^{14}$ (N/cm$^2$), which is illustrated by the triangular-shaped data point in FIG. 1.

Nitrided layers were also formed on wafers in an RTP apparatus supplied with an $N_2$ atmosphere. Layers were formed on three different wafers, each layer was formed at a different temperature and the temperatures that were used are listed in Table 2 below. The amount of nitrogen incorporated into these layers is also set forth in Table 2.

TABLE 2

| TIME | TEMPERATURE | AMOUNT OF NITROGEN (N/cm$^2$) |
| --- | --- | --- |
| 600 seconds | 850° C. | 8 × 10$^{14}$ |
| 280 seconds | 950° C. | 2 × 10$^{15}$ |
| 80 seconds | 1050° C. | 2.5 × 10$^{15}$ |

The data points in FIG. 1 that correspond to the data in Table 2 are designated by diamond-shaped symbols.

The nitrided layers were formed by placing silicon wafers that were cleaned using standard cleaning techniques in an RTP apparatus (the Integra®-1 model sold by AGI Incorporated). The first layer was formed by placing a wafer in the Integra® apparatus and heating the wafer to 850° C. in about 30 seconds. The wafer was maintained at that temperature for about 600 seconds. When the wafer was removed from the RTP apparatus, the thickness of the resulting nitrided layer was measured and found to be less than about 1 nm. The amount of nitrogen in the layer was measured as described above and found to be 8×10$^{14}$ atoms/cm$^2$.

A second layer was formed by repeating the procedure using a second silicon wafer and heating the wafer to 950° C. using the conditions and equipment previously specified. When the wafer was removed from the RTP apparatus, the thickness of the resulting nitrided layer was measured and found to about 1 nm. The amount of nitrogen in the layer was measured as described above and found to be 2×10$^{15}$ atoms/cm$^2$.

A third layer was formed by repeating the procedure using a third silicon wafer and heating the wafer to 1050° C. using the conditions and equipment previously specified. When the wafer was removed from the RTP apparatus, the thickness of the resulting nitrided layer was measured to be about 1.2 nm. The amount of nitrogen in the layer was determined to be $2.5 \times 10^{15}$ atoms/cm$^2$.

For purposes of comparison, silicon wafers were heated in a furnace supplied with an $N_2$ atmosphere. The wafers were heated at temperatures of 850° C. and 950° C. for times of 4 hours and 1 hour, respectively. The amount of nitrogen in the nitrided layer of the wafer heated at 850° C. was barely measurable, and the amount of nitrogen in the nitrided layer of the wafer heated to 950° C. was $8 \times 10^{13}$ atoms/cm$^2$. These data points are illustrated by the square symbols in FIG. 1.

FIG. 1 demonstrates that the nitrogen content of the layer that results from nitridation in an RTP apparatus with an $N_2$ atmosphere exceeded the nitrogen content in the silicon oxynitride formed in either a furnace or an RTP apparatus with an $N_2O$ atmosphere at a given temperature.

FIG. 1 also demonstrates that there is a significant difference in the amount of nitrogen incorporated into the nitrided layer formed in an RTP apparatus and the amount of nitrogen incorporated into the nitrided layer formed in a furnace at a given temperature. Although applicants do not wish to be held to a particular theory, applicants believe that the higher quantity of nitrogen that was incorporated into the silicon oxynitride formed in the RTP apparatus is due to the fact that the $N_2$ atmosphere in the RTP apparatus contains partial pressures of water, oxygen, carbon dioxide, and/or hydrogen that are significantly greater than the partial pressures of these impurities in the $N_2$ atmosphere in the furnace.

Specifically, at very low partial pressures of oxygen, the formation of the silicon oxynitride phase is preferred. The range of oxygen partial pressures that favor formation of the silicon oxynitride phase varies somewhat with temperature. The relationship between temperature, oxygen partial pressure and the formation of the silicon oxynitride phase is described in Hillert, M., et al, "Thermodynamic Calculation of the Si—N—O System" *Z. Metalkunde* Vol. 83, 648 (1992) which is hereby incorporated by reference. Thus, if the amount of oxygen, hydrogen and water vapor are controlled to provide a partial pressure of oxygen (at the nitridation temperature) that favors the formation of the silicon oxynitride phase, the nitrogen content of the resulting layer is increased.

The significantly greater amount of these impurities in the RTP apparatus atmosphere than in the furnace atmosphere results from the fact that these impurities condense on the RTP apparatus walls when those walls are cool, and the impurities vaporize when the apparatus is heated rapidly. Consequently water, oxygen, and/or hydrogen, are introduced into the $N_2$ atmosphere of the RTP apparatus. The concentration of these impurities is smaller in the furnace atmosphere because the furnace is continuously maintained at elevated temperature (typically at least at temperatures in the range of 600° to 700° C.). Therefore, less water condenses on the walls of the furnace than on the walls of the RTP apparatus, which cool to ambient temperature between cycles.

Also, applicants have observed that the partial pressure of oxygen affects the smoothness of the resulting nitrided layer. The higher the partial pressure of oxygen, the smoother the layer. Since there is a range of conditions that provide a partial pressure of oxygen that favors the formation of the oxynitride phase, one would select conditions that provide a higher partial pressure of oxygen within that range if a smoother surface is desired. In some applications a smoother surface improves device performance.

Figure 2:
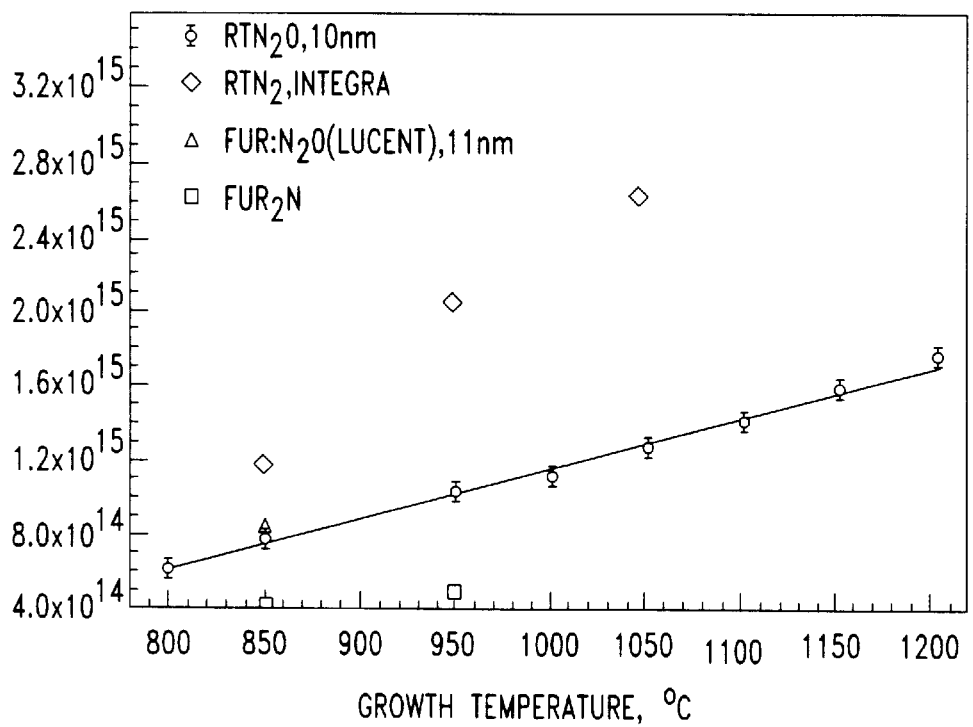
FIG. 2 illustrates the amount of nitrogen incorporated into the nitrided layer at various growth temperatures using two different RTP apparatus, each supplied with an $N_2$ atmosphere, and the amount of nitrogen present in silicon oxynitride layers formed at various growth temperatures in an RTP apparatus supplied with an $N_2O$ atmosphere.

FIG. 2 illustrates that the amount of nitrogen incorporated in the nitrided layer varies with the particular RTP apparatus used to form the layer. The diamond-shaped data points in FIG. 2 are the same data points as the diamond-shaped data points in FIG. 1, i.e. the nitrogen content of the layers formed on the three different wafers using an RTP apparatus supplied with a nitrogen atmosphere at 850° C., 950° C., and 1050° C., respectively. For purposes of comparison, a nitrided layer was formed using a different RTP apparatus, an 8108 Heatpulse® apparatus obtained from AG associates supplied with an $N_2$ atmosphere. A silicon wafer was placed in the apparatus and the temperature was increased to 950° C. in about 30 seconds. The wafer was maintained at this temperature for about 280 seconds. The wafer was removed from the apparatus and the thickness of the nitrided layer and the nitrogen content of the nitrided layer were measured in the manner previously described. The thickness of the layer was less than 1 nm and the nitrogen content was about $5 \times 10^{14}$ nitrogen atoms/cm$^2$. This experiment was repeated using a second wafer. The second film had a thickness and a nitrogen content comparable to that of the first film. The nitrogen content of these films is illustrated by the diamond outline symbols in FIG. 2.

Clearly, the RTP apparatus that was used affected the amount of nitrogen incorporated into the nitrided layer. This is illustrated by comparing the amount of nitrogen incorporated into the silicon oxynitride layer grown in an RTP apparatus with an $N_2O$ atmosphere (the solid line in FIG. 2) with that the amount of nitrogen in the nitrided films formed with the Integra® apparatus. From this comparison, it is apparent that the amount of nitrogen in the nitrided films formed with the Integra® apparatus far exceeded the amount of nitrogen in the films formed in an $N_2O$ atmosphere while the amount of nitrogen in the films formed with the Heatpulse® apparatus was comparable to the amount of nitrogen in the silicon oxynitride films formed in an $N_2O$ atmosphere. This suggests that the amount of nitrogen in the layer can be controlled if the amount of impurities in the $N_2$ atmosphere is controlled.

Figure 3:
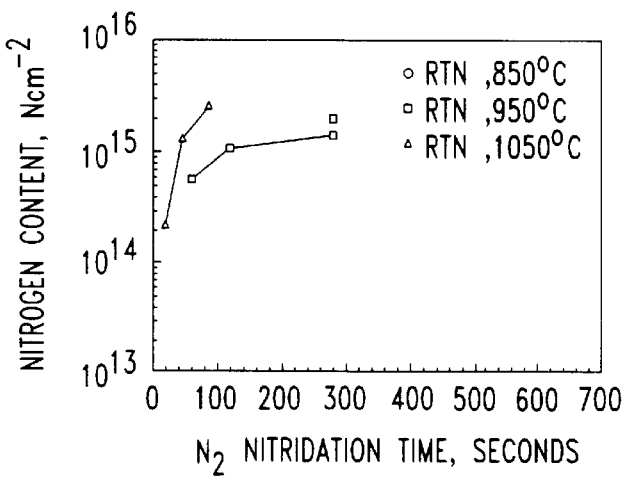
FIG. 3 illustrates the effect of time and temperature on the nitrogen content of a nitrided layer formed on a silicon substrate in an RTP apparatus supplied with an $N_2$ atmosphere.

As noted above, the amount of nitrogen incorporated into the nitrided layer varies with the amount of time to which the silicon wafer is subjected to the elevated temperature in an $N_2$ atmosphere. At 850° C. (the data point designated by the solid circle in FIG. 3) the amount of nitrogen incorporated into the nitrided layer in 10 minutes was about $1 \times 10^{15}$ atoms/cm$^2$. At 950° C. that amount was incorporated into the nitrided layer in a little over one minute. Note that at 950° C. the amount of nitrogen in the layer "levels off" after about 100 seconds. These data points are indicated as the squares in FIG. 3. The two data points at 300 seconds indicate that the results reported in FIG. 3 are reproducible. At 1050° C., the amount of nitrogen in the layer increases rapidly as the time increases from about 20 seconds to about 80 seconds. At this temperature, the amount of nitrogen incorporated into the layer is almost three times as much as the amount of nitrogen in the layer formed at 950° C. Furthermore, it took less time to incorporate more nitrogen into the nitrided layer at 1050° C. than at 950° C.

Figure 4:
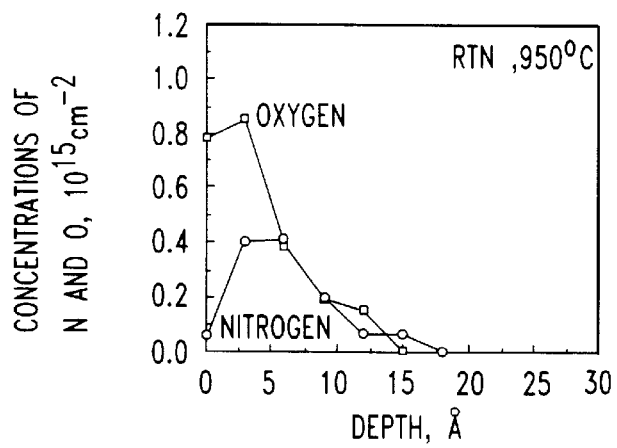
FIG. 4 illustrates the distribution of nitrogen and oxygen in a nitrided layer formed on a silicon substrate in an RTP apparatus supplied with an $N_2$ atmosphere.

As previously noted, the distribution of the nitrogen in the layer is related to device performance. FIG. 4 demonstrates that an advantageous distribution of nitrogen in the nitrided layer is obtained using the process of the present invention. FIG. 4 illustrates the nitrogen content and the oxygen content in the nitrided layer as a function of depth. The nitrided layer was formed by placing a silicon wafer in an Integra® RTP apparatus as previously described, providing a nitrogen atmosphere in the apparatus, heating the wafer to 950° C. in about 30 seconds and maintaining the wafer at that temperature for about 280 seconds. FIG. 4 illustrates that the peak nitrogen distribution is in the upper third of the layer after the nitridation step.

Figure 5:
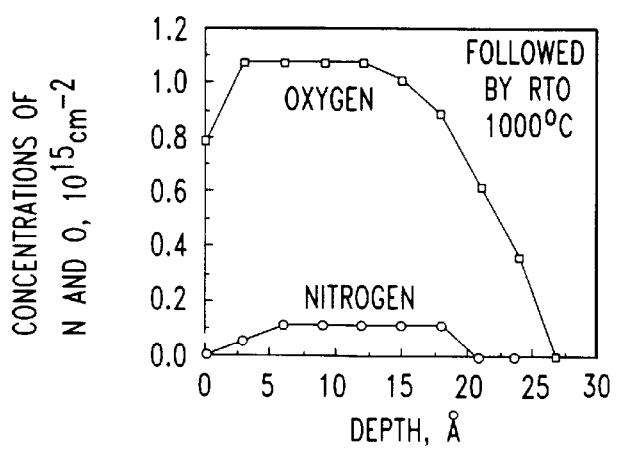
FIG. 5 illustrates the effect of rapid thermal oxidation on the distribution of nitrogen and oxygen in the film described in FIG. 4.

After the nitridation step, the wafer was subjected to an oxidation step at 1000° C. for 45 seconds to form a layer of silicon oxynitride. As illustrated in FIG. 5, the nitrogen is evenly distributed in the silicon oxynitride layer after the oxidations step. The nitride distribution was determined using medium energy ion scattering analysis. As noted above, it is advantageous if the nitrogen is uniformly distributed in the silicon oxynitride layer instead of concentrated at the interface between the silicon oxynitride layer and the underlying silicon. The advantage derives from the fact that boron will not penetrate as far into a layer in which the nitrogen is evenly distributed as it will into a layer in which the nitrogen is concentrated at the interface. Consequently, boron does not concentrate at the interface between the silicon oxynitride layer and the underlying silicon substrate and is therefore less likely to diffuse into the underlying silicon.

The thickness of the nitrided layer was 1.5 nm before the oxidation step and the thickness of the layer increased to 2.7 nm thick after the oxidation step. A comparison of FIGS. 4 and 5 also reveals that the peak nitrogen content in the nitrided layer ($0.4 \times 10^{15}$ atoms/cm$^2$) decreased to about half of that content ($0.2 \times 10^{15}$ atoms/cm$^2$) after the oxidation step.

What is claimed is:

1. A process for device fabrication comprising:

Subjecting a silicon substrate to a nitridation step by heating the substrate in a rapid thermal processing apparatus to a temperature in the range of about 850° C. to about 1050° C. in an $N_2$ atmosphere comprising an impurity selected from the group consisting of water, carbon dioxide, and hydrogen, and wherein the amount of impurity is controlled to provide a partial pressure of oxygen that favors the formation of the silicon oxynitride phase, followed by an oxidation step, thereby forming a layer of silicon oxynitride on the silicon substrate, wherein the nitridation step is of sufficient duration to provide a nitrogen content of at least about $5 \times 10^{13}$ cm$^{-2}$ in the silicon oxynitride layer.

2. The process of claim 1 wherein the silicon oxynitride layer is the gate oxide layer of the device.

3. The process of claim 1 wherein the oxidation step occurs at a temperature and for a period of time selected to provide a silicon oxynitride layer with a thickness of at least 1 nm.

4. The process of claim 3 wherein the oxidation step takes place at a temperature in the range of about 800° C. to about 950° C.

5. The process of claim 1 wherein the amount of impurity is about the amount of the impurity found in ambient air.

* * * * *